(12) United States Patent
Smith et al.

(10) Patent No.: US 7,126,391 B1
(45) Date of Patent: Oct. 24, 2006

(54) POWER ON RESET CIRCUITS

(75) Inventors: Sean Smith, Basingstoke (GB); James Lutley, Southampton (GB); Jonathan Churchill, Reading (GB)

(73) Assignee: Cypress Semiconductor Corporation, San Jose, CA (US)

( * ) Notice: Subject to any disclaimer, the term of this patent is extended or adjusted under 35 U.S.C. 154(b) by 253 days.

(21) Appl. No.: 10/889,245

(22) Filed: Jul. 12, 2004

Related U.S. Application Data

(60) Provisional application No. 60/487,819, filed on Jul. 16, 2003.

(51) Int. Cl.
*H03L 7/00* (2006.01)

(52) U.S. Cl. ........................... 327/143; 327/142
(58) Field of Classification Search ............... None
See application file for complete search history.

(56) References Cited

U.S. PATENT DOCUMENTS

| | | | |
|---|---|---|---|
| 5,115,146 A | 5/1992 | McClure | |
| 5,159,217 A * | 10/1992 | Mortensen et al. | 327/143 |
| 5,187,389 A | 2/1993 | Hall et al. | |
| 5,394,104 A | 2/1995 | Lee | |
| 5,523,709 A | 6/1996 | Phillips et al. | |
| 5,528,182 A | 6/1996 | Yokosawa | |
| 5,563,799 A * | 10/1996 | Brehmer et al. | 702/186 |
| 5,564,010 A * | 10/1996 | Henry et al. | 714/22 |
| 5,694,067 A * | 12/1997 | Hull et al. | 327/143 |
| 5,821,787 A * | 10/1998 | McClintock et al. | 327/143 |
| 5,831,460 A * | 11/1998 | Zhou | 327/143 |
| 5,844,434 A | 12/1998 | Eschauzier | |
| 5,850,156 A * | 12/1998 | Wittman | 327/143 |
| 6,060,918 A | 5/2000 | Tsuchida et al. | |
| 6,204,701 B1 | 3/2001 | Tsay et al. | |
| 6,259,285 B1 * | 7/2001 | Woods | 327/143 |
| 6,271,714 B1 | 8/2001 | Shin | |
| 6,384,670 B1 * | 5/2002 | Eagar et al. | 327/539 |
| 6,437,614 B1 | 8/2002 | Chen | |
| 6,618,312 B1 * | 9/2003 | Cheung et al. | 365/226 |
| 6,677,787 B1 | 1/2004 | Kumar et al. | |
| 6,879,194 B1 | 4/2005 | Caldwell | |
| 7,030,668 B1 * | 4/2006 | Edwards | 327/143 |
| 2002/0027460 A1 | 3/2002 | Kobayashi et al. | |
| 2003/0011411 A1 | 1/2003 | Sterrantino et al. | |
| 2004/0012418 A1 | 1/2004 | Kim | |
| 2004/0066218 A1 | 4/2004 | Suzuki | |
| 2004/0189357 A1 | 9/2004 | Kang et al. | |
| 2005/0140406 A1 | 6/2005 | Rizzo et al. | |
| 2005/0195000 A1 | 9/2005 | Parker et al. | |

* cited by examiner

*Primary Examiner*—Timothy P. Callahan
*Assistant Examiner*—Cassandra Cox
(74) *Attorney, Agent, or Firm*—Okamoto & Benedicto LLP

(57) ABSTRACT

In one embodiment, a power on reset circuit includes a main circuit and a translation circuit. The main circuit may be configured to receive an external signal and to generate an input signal that is indicative of a state of the external signal. The translation circuit may be configured to receive the input signal and provide a power on reset signal indicative of a brownout condition of the external signal. The external signal may be a relatively high voltage signal compared to the power on reset signal.

20 Claims, 5 Drawing Sheets

US 7,126,391 B1

POWER ON RESET CIRCUITS

REFERENCE TO RELATED APPLICATION

This application claims the benefit of U.S. Provisional Application No. 60/487,819, entitled "Power On Reset Circuits," filed on Jul. 16, 2003 by Sean Smith, James Lutley, and Jonathan Churchill, which is incorporated herein by reference in its entirety.

BACKGROUND OF THE INVENTION

1. Field of the Invention

The present invention relates generally to electrical circuits, and more particularly but not exclusively to power on reset circuits.

2. Description of the Background Art

A power on reset circuit generates a signal indicative of the status of a monitored power source provided to the circuit. For example, the power on reset circuit may generate a logical LOW signal when the monitored power source is below a trip point, and a logical HIGH signal when the monitored power source is above the trip point. The signal may be provided to another circuit that operates depending on the state of the signal. For example, the other circuit may be reset when the signal indicates that the monitored power source is below the trip point.

FIG. 1 shows a schematic diagram of an exemplary power on reset ("POR") circuit 100. As shown in FIG. 1, POR circuit 100 comprises a main circuit 180 and a translation circuit 190. Main circuit 180 includes a resistor ladder comprising resistors R1, R2, R3, and R4. The voltage across R4, which is a scaled version of the monitored external voltage Vcch, is coupled to control the gate of transistor M1. When the voltage on the gate of transistor M1 is below its threshold voltage (the trip point in this example), transistor M1 is OFF, thereby providing Vcch on node 110 via resistors R6 and R5. When the voltage on the gate of transistor M1 is above the trip point, transistor M1 is ON, thereby pulling node 110 to ground. Capacitor C1 sets the pulse width and brownout sensitivity of POR circuit 100. Capacitor C2 prevents stray capacitance from causing the output of transistor M1 (i.e., node 110) to be OFF when resistor R6 is very weak. Transistor M2 provides some hysteresis by modifying the falling trip point of POR circuit 100. The effects of transistor M2 and capacitors C1 and C2 are not relevant to the present disclosure, and will not be taken into account in the following analysis in the interest of clarity.

In a typical application, the signal on node 110, which is indicative of the state of Vcch, may be directly provided to another circuit. However, in applications where there is voltage incompatibility between main circuit 180 and the other circuit, a translation circuit may be employed between the two circuits. In circuit 100, translation circuit 190 allows the signal on node 110 of main circuit 180 to be provided to a low voltage, single gate oxide (SGOX) transistor coupled to node 130.

One problem with circuit 100 is that it has a tendency to not provide a correct output signal on node 130 during brownouts. For example, the POR output signal on node 130 may not indicate the correct state of Vcch when Vcch dips below the trip point. FIG. 2 shows waveforms illustrating improper operation of a power on reset circuit. In the examples of FIG. 2 and subsequently described FIG. 3, a logical HIGH POR output indicates a proper external voltage Vcch, while a logical LOW POR output indicates a brownout. In the example of FIG. 2, the POR output does not pull down to ground (i.e., logical LOW) even when Vcch goes below the trip point during a brownout (see arrows 212 and 213). FIG. 3 shows waveforms illustrating proper operation of a power on reset circuit. As shown in FIG. 3, the POR output should pull to ground (see arrows 312 and 313) when Vcch dips below the trip point, indicating to other circuits that a brownout has occurred.

SUMMARY

In one embodiment, a power on reset circuit includes a main circuit and a translation circuit. The main circuit may be configured to receive an external signal and to generate an input signal that is indicative of a state of the external signal. The translation circuit may be configured to receive the input signal and provide a power on reset signal indicative of a brownout condition of the external signal. The external signal may be a relatively high voltage signal compared to the power on reset signal.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided such as examples of circuits, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Embodiments of the invention will be described using SGOX transistors as examples. It should be understood, however, that the present invention is not so limited and may be employed in other applications involving other types of transistors, for example.

Figure 4:
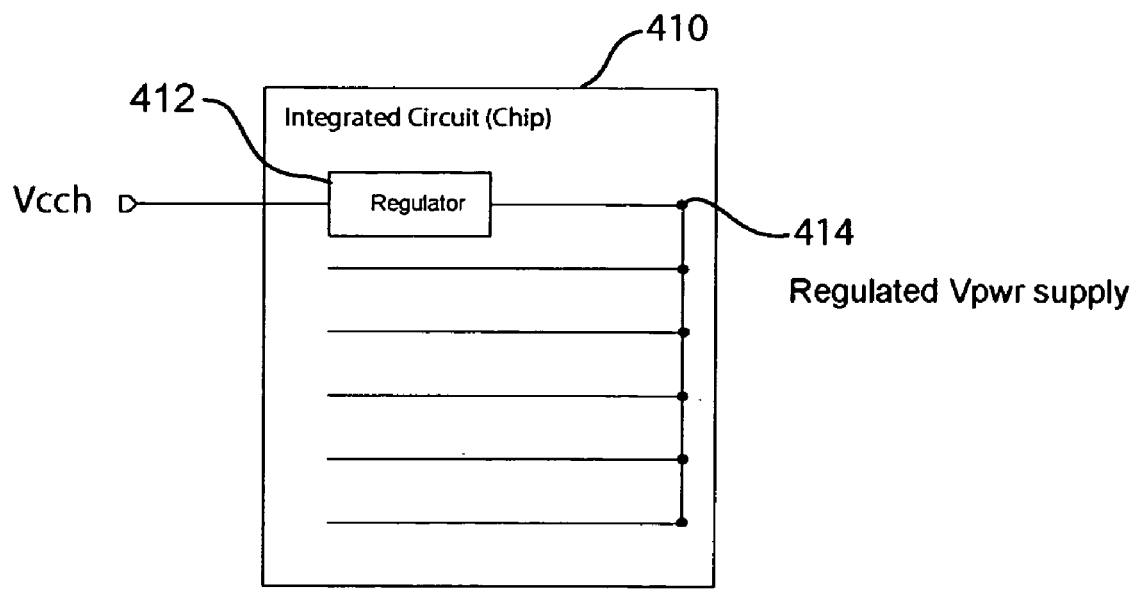
FIG. 4 shows a schematic diagram of power supplies provided to and internally generated in an integrated circuit.

The gate oxide of transistors gets thinner as process technologies allow integrated circuits to shrink. As a result, the voltage that can be applied to the gate of a transistor goes down. If the voltage across a gate oxide is too high, the gate oxide may break down and thereby destroy the transistor. Accordingly, many integrated circuits, which are also referred to as "chips," now have on-chip voltage regulators to supply the internal chip power as shown in FIG. 4. In the example of FIG. 4, an integrated circuit 410 includes an on-chip voltage regulator 412 for stepping down an external voltage Vcch to a lower internal power supply voltage Vpwr on node 414. The internal power supply voltage Vpwr on node 414 may be employed to power up low-voltage circuits in integrated circuit 410.

Note that for purposes of the present disclosure, "Vcch" refers to an external voltage or signal externally provided to an integrated circuit, and "Vpwr" refers to a voltage or signal internally generated in the integrated circuit. "Vcch" typically has a relatively high voltage compared to "Vpwr." For example, a voltage Vcch may be equal to or greater than 3V, and a voltage Vpwr may be equal to or less than 2.5V.

One way of accommodating a relatively high external voltage is to use two types of transistors in the integrated circuit: standard, low voltage transistors (e.g. capable of <2.5V Vgs) and high voltage transistors with thicker gate oxide for higher voltages (e.g capable of <4.6V Vgs). The high voltage transistors may be used to build interfaces to the outside world, such as inputs, outputs, regulator and power on reset circuits, whilst the internals of the integrated circuit may use the smaller and faster low voltage transistors running off of a lower voltage, regulated internal power supply, such as that on node 414 (see FIG. 4). This use of two types of transistors with different gate oxide thicknesses is also referred to as "dual gate oxide technology." Dual gate oxide technology is more expensive to develop and manufacture than single gate oxide (SGOX) technology. In a single gate oxide technology, transistor gate oxides have similar thicknesses. Accordingly, using SGOX technology, an integrated circuit may only have low voltage transistors, so circuitry to accommodate higher voltages is provided to allow the integrated circuit to operate without destroying the gate oxides of low voltage transistors.

Figure 5:
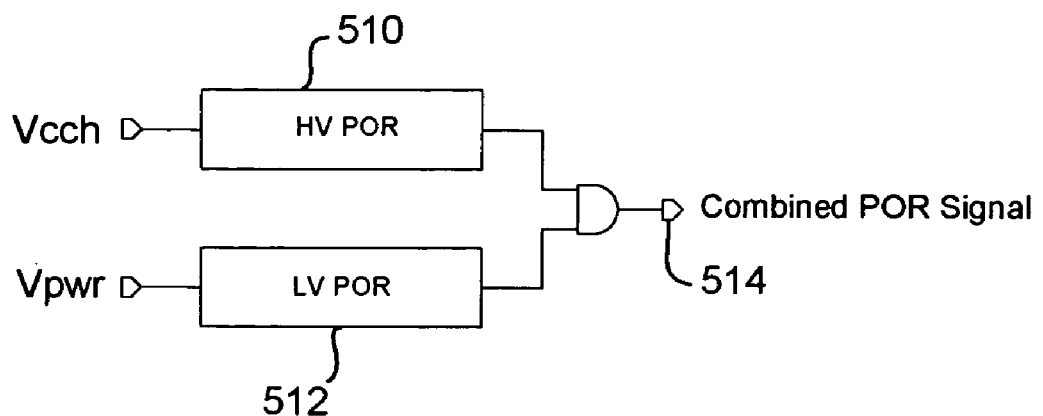
FIG. 5 shows a schematic diagram of a power on reset circuit monitoring internally generated and externally generated power supplies.

For an integrated circuit that has an internal regulated low voltage power supply and an external unregulated high voltage power supply, the two power supplies may be monitored as shown in FIG. 5. In the example of FIG. 5, a high voltage power on reset (HV POR) circuit 510 monitors an external high voltage power supply Vcch, and a low voltage power on reset (LV POR) circuit 512 monitors the internal regulated low voltage power supply Vpwr. The outputs of the HV POR circuit 510 and LV POR circuit 512 may be gated together to generate a combined POR output signal on node 514. The same circuit configuration, such as that of main circuit 180 of FIG. 1, may be used for both the HV POR circuit 510 and the LV POR circuit 512 except that high voltage transistors are employed in HV POR circuit 510. Using SGOX technology, however, there are no high voltage transistors available for use in external interfacing circuits and in a high voltage power on reset circuit.

A power on reset circuit designed to work with low voltage, SGOX transistors needs to be able to operate correctly in power up (power supply voltage rising from ground), power down, and brownout (instantaneous powering down) conditions, whilst protecting the SGOX transistors from excessive voltages (e.g., Vgs>2.5 volts) when the externally provided voltage (e.g., Vcch) is relatively high (e.g., about 3.63 volts). One of the main considerations in designing a power on reset circuit is how to make the circuit work correctly during brownout conditions. This is partly because of the unknown state of the power supplies and employed reference signals during a brownout. A brownout occurs when an external power supply voltage drops to a level below the operating range of the chip for a certain period of time, such as when a 3.3 volt power supply drops to 1.5V for 10 µs, for example.

Figure 1:
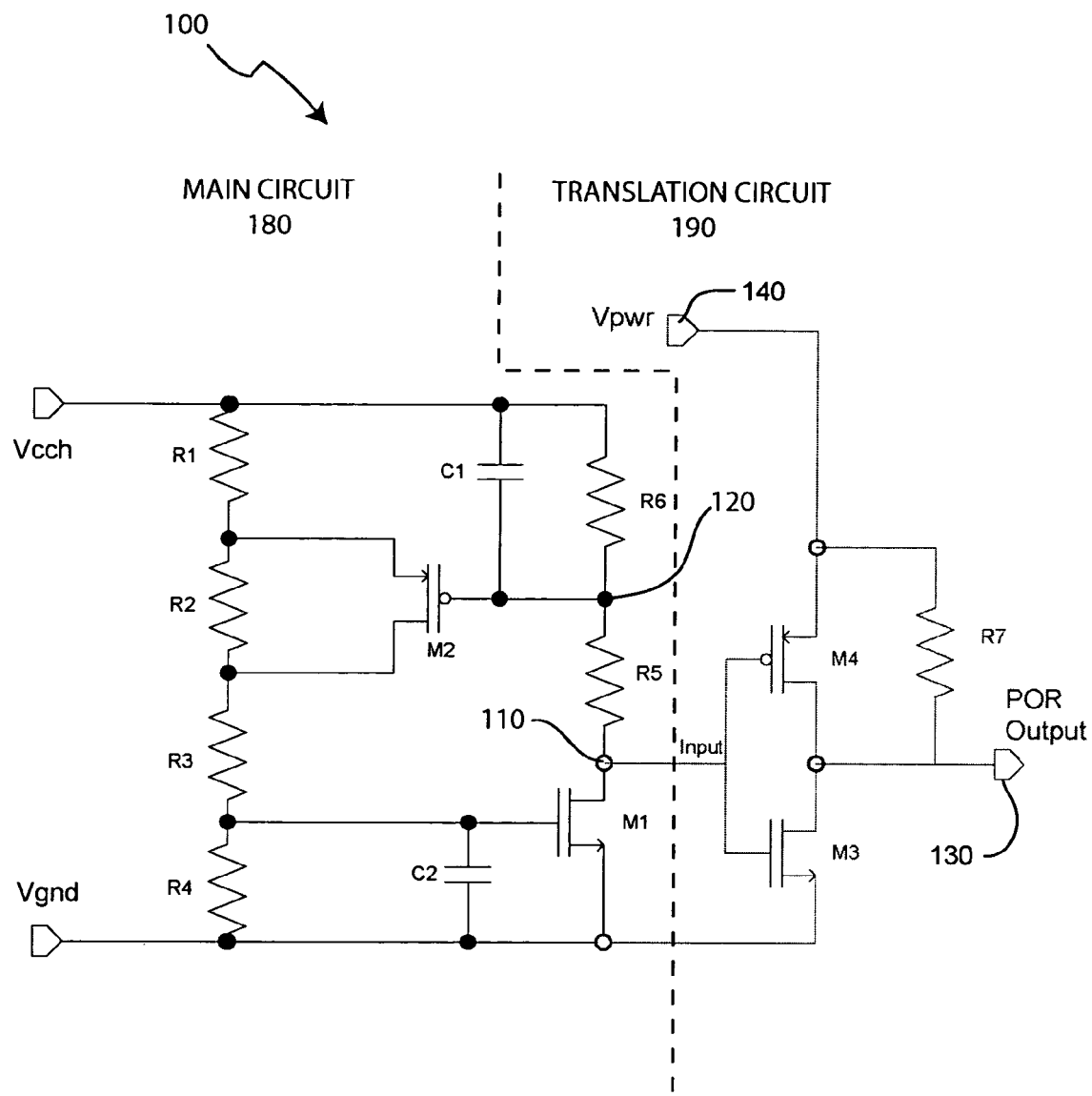
FIG. 1 shows a schematic diagram of an exemplary power on reset circuit.
Figure 2:
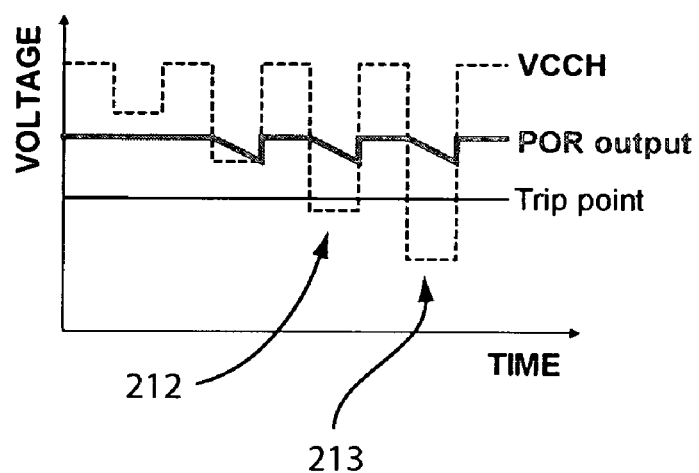
FIG. 2 shows waveforms illustrating an improper operation of a power on reset circuit.
Figure 3:
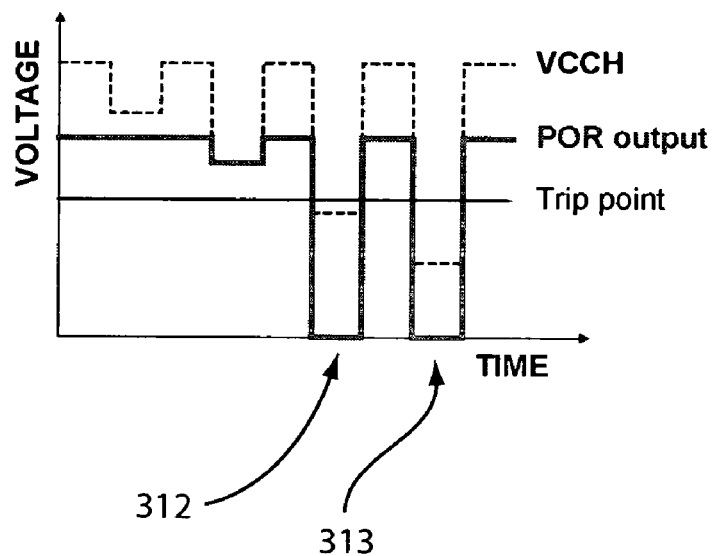
FIG. 3 shows waveforms illustrating a proper operation of a power on reset circuit.

In the POR circuit 100 of FIG. 1, the voltage on node 110 may vary between 0V and approximately 1V depending on implementation. Note that the signal on node 110 cannot simply drive an inverter for voltage translation. This is partly because during a brownout of Vcch, the internal power supply voltage Vpwr on node 140 can remain high for a short period of time (e.g., <3.5 µs) due to chip capacitance. This would result in a logical HIGH output on node 130 (thus failing to provide the correct POR output pulse) until the Vpwr on node 140 falls below a voltage level that is below the external voltage Vcch.

Figure 6:
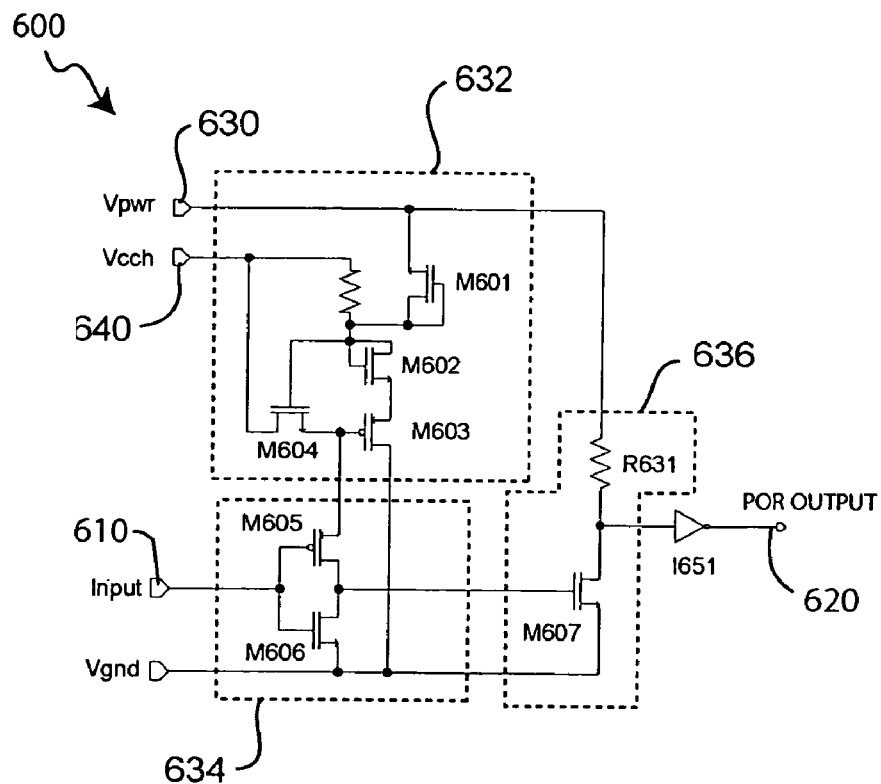
FIGS. 6–8 show translation circuits in accordance with embodiments of the present invention.

Referring now to FIG. 6, there is shown a schematic diagram of a translation circuit 600 in accordance with an embodiment of the present invention. Instead of using translation circuit 190, translation circuit 600 may be employed with main circuit 180 of POR circuit 100 to create a power on reset circuit suitable for driving low voltage internal circuits, for example. Node 610 of circuit 600 may be coupled to node 110 of main circuit 180 to form a power on reset circuit. A power on reset circuit incorporating translation circuit 600 and later described translation circuits 700 (FIG. 7) and 800 (FIG. 8) may be employed in an HV POR circuit 510 (FIG. 5) of an integrated circuit employing dual voltage supplies, for example. Also, in one embodiment, translation circuits 600, 700, and 800 are employed in integrated circuits fabricated using SGOX technology.

As shown in FIG. 6, circuit 600 may include a voltage clipper/clamper circuit 632 for powering an inverter 634 with an internal power supply voltage Vpwr from node 630. In the example of FIG. 6, clipper/clamper circuit 632 comprises transistors M601, M602, M603, and M604, and inverter 634 comprises transistors M605 and M606.

In the example of FIG. 6, the external voltage Vcch on node 640 can rise all the way to about 3.63 volts and the voltage to inverter 634 will be clipped to Vpwr whilst maintaining over-voltage protection. If the external voltage Vcch drops below Vpwr, the output of the clipper/clamper circuit 632 coupled to the source of transistor M605 will track the Vcch voltage on node 640. If Vcch browns out while Vpwr remains constant, the power on reset circuit (i.e., main circuit 180 with translation circuit 600) will still produce a POR output pulse on node 620 because the input to transistor M607 will drop below the NMOS threshold voltage and thereby cause a translator inverter I651 to produce a logical LOW signal. A passive load inverter 636 is preferably used over a typical CMOS inverter to ensure that the output of the translator inverter I651 gives the correct logic state when Vpwr>Vcch during the initial period of the brownout (a PMOS pull-up would turn ON when Vpwr>Vcch causing a false high value on the POR output). In the example of FIG. 6, passive load inverter 636 comprises a transistor M607 and a resistor R631.

Figure 7:
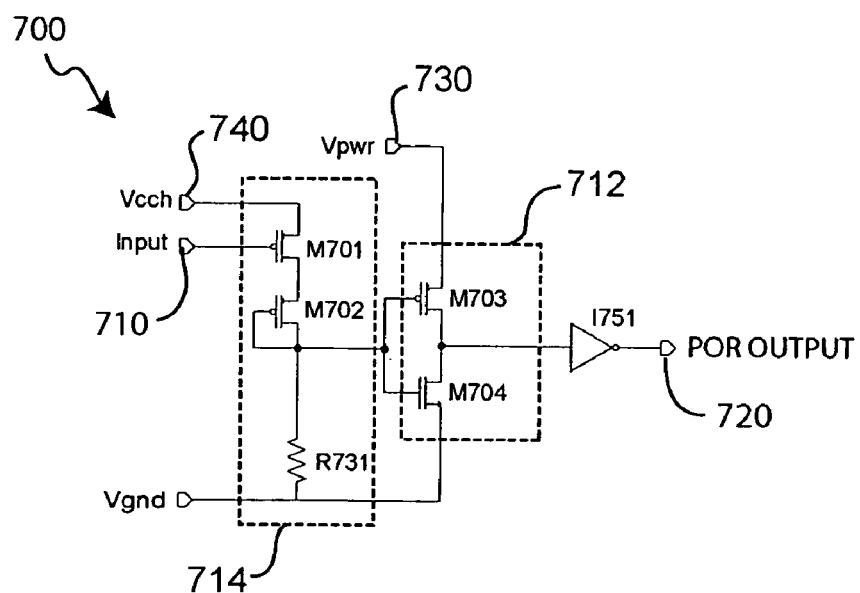

Turning now to FIG. 7, there is shown a schematic diagram of a translation circuit 700 in accordance with another embodiment of the present invention. Instead of using translation circuit 190, translation circuit 700 may be employed with main circuit 180 of POR circuit 100 to create a power on reset circuit suitable for driving low voltage internal circuits, for example. Node 710 of circuit 700 may be coupled to node 120 of main circuit 180 to form a power on reset circuit. In circuit 700, transistor M702 is diode connected to provide over-voltage protection for transistors M703 and M704, which form an inverter 712. Transistors M701 and M702 and resistor R731 form an inverter 714. The input voltage on node 710 has been altered so that it does not fall beneath about 1 volt but can rise to the level of an external voltage Vcch on node 740. This input voltage change on node 710 is achieved by connecting node 710 to node 120 of main circuit 180 instead of to the regular tap point on node 110. When the input voltage on node 710 is at Vcch, the POR output signal on node 720 is active LOW. When the input voltage on node 710 drops to about 1 volt, transistor M701 turns ON and the POR output signal on node 720 is inactive HIGH. In a brownout situation, the external voltage Vcch on node 740 and the input voltage on node 710 can drop to 0 volts, during which the internal power supply Vpwr on node 730 can remain steady for a short while. In this scenario, the POR output on node 720 will still be active LOW. A POR output signal on node 720 will have been produced due to the brownout of the voltage Vcch on node 740.

Figure 8:
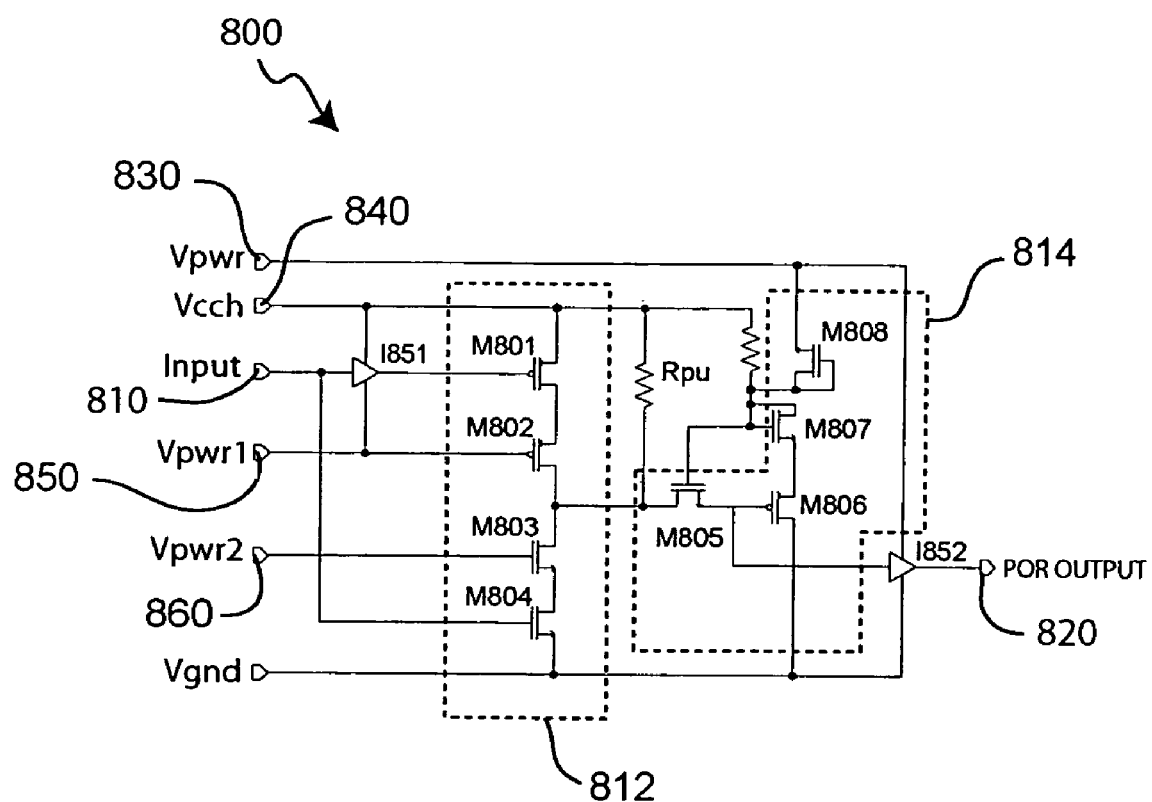

FIG. 8 shows a schematic diagram of a translation circuit 800 in accordance with another embodiment of the present invention. Instead of using translation circuit 190, translation circuit 800 may be employed with main circuit 180 of circuit 100 to create a power on reset circuit suitable for driving low voltage internal circuits, for example. Node 810 of circuit 800 may be coupled to node 110 of main circuit 180 to form a power on reset circuit. In the example of FIG. 8, circuit 800 employs two reference voltages Vpwr1 and Vpwr2 on nodes 850 and 860, respectively. References voltages Vpwr1 and Vpwr2 may be internally generated voltages targeted at a level that just switches the associated transistors M802 and M8030N. Transistors M802 and M803 provide over-voltage protection. Vpwr1 and Vpwr2 may be produced from a resistor stack powered from an external voltage Vcch or by other means. The voltage on the input node 810 may have a range of about 0 volt to 1 volt, which allows for direct connection to transistor M804. In the example of FIG. 8, the voltage on the input node 810 is also fed into inverter I851. Inverter I851 serves as a buffer that uses the external voltage Vcch on node 840 as its high supply and reference voltage Vpwr1 as its low supply. When the input voltage on node 810 is LOW, inverter I851 provides an output voltage at a level of Vpwr1. When the input voltage on node 810 is HIGH, inverter I851 provides an output voltage at a level of Vcch. The use of inverter I851 provides over-voltage protection to the gate of transistor M801.

Still referring to FIG. 8, an inverter stack 812 comprises transistors M801, M802, M803, and M804. The output of the inverter stack 812 may have a range of about 0 volt to 3.63 volts, which in the example of FIG. 8 is still above internal regulated voltage levels (e.g., Vpwr on node 830). The output of the inverter stack 812 is fed into a clipper/clamper circuit 814 comprising transistors M805, M806, M807, and M808. This limits the voltage provided to inverter I852 to the reference supply voltage Vpwr, from node 830. The POR output signal on node 820 is thus a low voltage signal for use internally in the integrated circuit.

During a brownout, the external voltage Vcch on node 840, reference voltage Vpwr1 on node 850, and reference voltage Vpwr2 on node 860 can potentially drop to 0V while the internal power supply voltage Vpwr on node 830 remains constant for a short while. In this scenario, the output from the inverter stack 812 may not be driven. In that case, the resistor Rpu will pull the input to the clipper/clamper circuit 814 to Vcch. As Vcch approaches 0 volt, the POR output signal on node 820 will be driven LOW. A POR output pulse is thus produced on node 820 as a result of the brownout of Vcch.

As can be appreciated by those of ordinary skill in the art reading the present disclosure, embodiments of the present invention allow an integrated circuit without high voltage transistors to generate a power on reset signal indicative of a state of a relatively high externally provided voltage or signal. Embodiments of the present invention may include a main circuit to accept and monitor the external voltage and a translation circuit to allow the signals from the main circuit to be converted to a power on reset signal suitable for use by internal low voltage circuits. The translation circuit may use both the external voltage and an internally generated voltage to generate the power on reset signal.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A power on reset circuit in an integrated circuit, the power on reset circuit comprising:
   a main circuit configured to receive an external voltage externally provided to the integrated circuit, the external voltage having a voltage range that is not suitable for use by an internal circuit in the integrated circuit, the main circuit being configured to generate an input signal indicative of a state of the external voltage; and
   a translation circuit configured to receive the input signal, the external voltage, and an internal power supply voltage for powering the internal circuit, the translation circuit being configured to assert a power on reset signal suitable for use by the internal circuit in an event of a brownout condition.

2. The power on reset circuit of claim 1 wherein the translation circuit comprises:
   a first inverter coupled to receive the input signal; and
   a clipper/clamper circuit configured to power the first inverter.

3. The power on reset circuit of claim of the claim 2 wherein the clipper/clamper circuit provides a voltage to the first inverter that tracks the external voltage during a brownout condition.

4. The power on reset circuit of claim 2 further comprising:
   a second inverter coupled to an output of the first inverter, the second inverter being configured to generate the power on reset signal.

5. The power on reset circuit of claim 4 wherein the second inverter comprises a passive load inverter.

6. The power on reset circuit of claim 5 wherein the passive load inverter comprises:
   a transistor, the gate of the transistor being coupled to the output of the first inverter; and
   a resistor coupling the internal power supply voltage to the transistor.

7. The power on reset circuit of claim 1 wherein the translation circuit comprises:
   a first inverter coupled to receive the input signal and the external voltage, the first inverter including a diode-connected transistor configured to provide over-voltage protection to a second inverter configured to generate the power on reset signal.

8. The power on reset circuit of claim 7 wherein the second inverter is configured to receive power from the internal power supply voltage.

9. The power on reset circuit of claim 1 wherein the translation circuit comprises:
   an inverter stack configured to receive the external voltage, the internal power supply voltage, a first internal reference voltage and a second internal reference voltage, the inverter stack being configured to provide an output signal based on the state of the external voltage; and a clipper/clamper circuit configured to receive an output of the inverter stack and generate the power on reset signal, the clipper/clamper circuit being powered by the internal power supply voltage.

10. The power on reset circuit of claim 9 further comprising:
an inverter configured to provide the power on reset signal to the internal circuit, the inverter being powered by the internal power supply voltage.

11. An integrated circuit comprising:
a first circuit configured to receive an external signal externally provided to the integrated circuit and an input signal indicative of a brown out condition of the external signal, the first circuit being configured to provide an output signal based on a voltage level of the input signal and a voltage level of the external signal; and
a second circuit configured to receive the output signal and to generate a power on reset signal during a brown out of the external signal, the second circuit being powered by an internal power supply voltage.

12. The integrated circuit of claim 11 wherein the first circuit comprises:
an inverter configured to buffer the input signal and to provide the output signal to the second circuit; and
a clipper/clamper circuit configured to provide power to the inverter by tracking the external signal.

13. The integrated circuit of claim 12 wherein the second circuit comprises a passive load inverter.

14. The integrated circuit of claim 11 wherein the first circuit comprises:
a first inverter powered by the external signal and configured to generate the output signal, the inverter comprising a diode-connected transistor configured to provide over-voltage protection to the second circuit.

15. The integrated circuit of claim 14 wherein the second circuit comprises a second inverter powered by the internal power supply voltage, the second inverter being configured to receive the output signal and drive a third inverter configured to generate the power on reset signal.

16. The integrated circuit of claim 14 wherein the first circuit comprises an inverter stack configured to receive the input signal by way of an inverter powered by the external signal.

17. The integrated circuit of claim 16 wherein the second circuit comprises a clipper/clamper circuit configured to generate the power on signal based on an output of the inverter stack, the clipper/clamper circuit being powered by the internal power supply voltage.

18. A method of providing a power on reset signal in an integrated circuit, the method comprising:
receiving an external signal in an integrated circuit, the external signal having a voltage range that is not suitable for use by an internal circuit in the integrated circuit;
generating an input signal indicative of a brownout condition of the external signal; and
using the external signal and an internal power supply voltage to translate the input signal and generate a power on reset signal having a voltage range suitable for use by the internal circuit.

19. The method of claim 18 wherein the external signal is limited by a clipper/clamper circuit and provides power to a first inverter driven by the input signal, the output of the first inverter being employed to drive a second inverter configured to generate the power on reset signal.

20. The method of claim 18 wherein the external signal is used to power a first circuit configured to receive the input signal and to drive a second circuit, the second circuit being powered by the internal power supply voltage and configured to generate the power on reset signal.

* * * * *